(12) United States Patent
Wang et al.

(10) Patent No.: US 9,012,291 B2
(45) Date of Patent: Apr. 21, 2015

(54) BIPOLAR TRANSISTOR WITH EMBEDDED EPITAXIAL EXTERNAL BASE REGION AND METHOD OF FORMING THE SAME

(71) Applicant: Tsinghua University, Beijing (CN)

(72) Inventors: Yu-dong Wang, Beijing (CN); Jun Fu, Beijing (CN); Jie Cui, Beijing (CN); Yue Zhao, Beijing (CN); Zhi-hong Liu, Beijing (CN); Wei Zhang, Beijing (CN); Gao-qing Li, Beijing (CN); Zheng-li Wu, Beijing (CN); Ping Xu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 14/335,468

(22) Filed: Jul. 18, 2014

(65) Prior Publication Data

US 2014/0329368 A1 Nov. 6, 2014

Related U.S. Application Data

(62) Division of application No. 13/625,211, filed on Sep. 24, 2012, now abandoned.

(30) Foreign Application Priority Data

May 16, 2012 (CN) .......................... 2012 1 0153063
May 16, 2012 (CN) .......................... 2012 1 0153148
May 16, 2012 (CN) .......................... 2012 1 0153410

(51) Int. Cl.
*H01L 21/331* (2006.01)
*H01L 21/02* (2006.01)
(Continued)

(52) U.S. Cl.
CPC .... *H01L 29/66234* (2013.01); *H01L 29/66242* (2013.01); *H01L 29/7378* (2013.01); *H01L 29/0817* (2013.01); *H01L 29/1004* (2013.01); *H01L 29/165* (2013.01); *H01L 29/207* (2013.01)

(58) Field of Classification Search
CPC ...................... H01L 29/1004; H01L 29/66242; H01L 29/7378
USPC .......... 438/363, 285, 350, 309, 312; 257/592, 257/197, 13, 565, 586
See application file for complete search history.

(56) References Cited

U.S. PATENT DOCUMENTS 5,316,957 A * 5/1994 Spratt et al. .................... 438/311
5,985,708 A * 11/1999 Nakagawa et al. ............ 438/206
(Continued)

*Primary Examiner* — Shaun Campbell
*Assistant Examiner* — Thai T Vuong
(74) *Attorney, Agent, or Firm* — Renner, Otto, Boisselle & Sklar, LLP.

(57) ABSTRACT

The present invention discloses a bipolar transistor with an embedded epitaxial external base region, which is designed to solve the problem of the TED effect with the prior art structures. The bipolar transistor with an embedded epitaxial external base region of the present invention comprises at least a collector region, a base region and an external base region on the collector region, an emitter on the base region, and sidewalls at both sides of the emitter. The external base region is grown through an in-situ doping selective epitaxy process and is embedded in the collector region. A portion of the external base region is located beneath the sidewalls. The present invention discloses a method of forming a bipolar transistor with an embedded epitaxial external base region. The bipolar transistor with an embedded epitaxial external base region of the present invention avoids the TED effect and reduces the resistance of the external base region of the device so that the performance of the device is improved. The method of forming a bipolar transistor with an embedded epitaxial external base region of the present invention achieves the aforesaid bipolar transistor with an embedded epitaxial external base region, and features concise steps, a low cost and simple operations, and the structure obtained has good performance.

17 Claims, 15 Drawing Sheets

(51) Int. Cl.
  *H01L 29/66* (2006.01)
  *H01L 29/737* (2006.01)
  *H01L 29/02* (2006.01)
  *H01L 29/10* (2006.01)
  *H01L 29/08* (2006.01)
  *H01L 29/165* (2006.01)
  *H01L 29/207* (2006.01)

(56) References Cited

U.S. PATENT DOCUMENTS

2002/0084494 A1\* 7/2002 Benaissa et al. ............. 257/370
2004/0065875 A1\* 4/2004 Ohnishi et al. ................ 257/19
2006/0011944 A1\* 1/2006 Fujiwara et al. ............. 257/197
2006/0071239 A1\* 4/2006 Saito et al. .................... 257/192
2006/0113634 A1\* 6/2006 Ahmed et al. ................ 257/565
2006/0170074 A1\* 8/2006 Ibara ............................ 257/565
2006/0186510 A1\* 8/2006 Lochtefeld et al. ........... 257/565
2007/0111459 A1\* 5/2007 Suma et al. ................... 438/309
2008/0217742 A1\* 9/2008 Johnson et al. ............... 257/592
2009/0050961 A1\* 2/2009 Takaishi ....................... 257/337
2011/0147892 A1\* 6/2011 Chiu et al. .................... 257/565
2013/0009280 A1   1/2013 Camillo-Castillo et al.

\* cited by examiner

BIPOLAR TRANSISTOR WITH EMBEDDED EPITAXIAL EXTERNAL BASE REGION AND METHOD OF FORMING THE SAME

RELATED APPLICATION DATA

This application is a divisional application of U.S. patent application Ser. No. 13/625,211, filed Sep. 24, 2012, the disclosure of which is incorporated herein by reference in its entirety.

BACKGROUND OF THE INVENTION

1. Technical Field

The present invention relates to a bipolar transistor with an embedded epitaxial external base region and a method of forming the same.

2. Description of Related Art

Millimeter wave and terahertz (THZ) applications will become the future development trend of wireless technologies, examples of which are millimeter wave communication, THZ communication, THZ imaging and the like. Currently, implementation of these applications mainly relies on Group III-V compound devices, and this has shortcomings such as a low integration level and a high cost. With the continuous development of the technologies, SiGe devices and technologies will become a competitor of the Group III-V compound devices. Currently, the SiGe technologies are widely used in such fields as communication, radar and high-speed circuits. The cut-off frequency Ft of the commercial SiGe process of the IBM has reached 350 GHz, and the maximum oscillation frequency Fmax of the SiGe devices developed by the European IHP has reached 500 GHz at the normal temperature. For the future millimeter wave and THZ applications, the SiGe devices still need to be continuously improved in performance, and this requires a novel structure for the SiGe devices.

External base regions of conventional bipolar transistors are usually processed through ion implantation and the performance of the resulting structures has shortcomings such as transient enhanced diffusion (TED) effect which will degrade the microwave performance of the devices. Some novel SiGe Heterojunction bipolar devices are formed by raised extrinsic base regions, but the external base regions beneath sidewalls in the resulting structures have a relatively large resistance, which reduces the microwave performance of the devices.

BRIEF SUMMARY OF THE INVENTION

To overcome the aforesaid shortcomings, the present invention provides a bipolar transistor with an embedded epitaxial external base region which can avoid the TED effect.

To achieve the aforesaid objective, in an aspect, the present invention provides a bipolar transistor with an embedded epitaxial external base region, which comprises at least a collector region, a base region and an external base region on the collector region, an emitter on the base region, and sidewalls at both sides of the emitter. The external base region is grown through an in-situ doping selective epitaxy process and is embedded in the collector region.

Particularly, a portion of the external base region is located beneath the sidewalls.

In another aspect, the present invention provides a method of forming a bipolar transistor with an embedded epitaxial external base region, which comprises at least the following steps:

3.1 forming a collector region of a first doping type;

3.2 forming a base region of a second doping type on the resulting structure of the step 3.1;

3.3 depositing a first dielectric layer on the base region;

3.4 opening a window in the first dielectric layer;

3.5 forming a polycrystalline layer of the first doping type and a second dielectric layer in sequence on the resulting structure of the step 3.4;

3.6 etching the second dielectric layer and the polycrystalline layer through photolithography to form an emitter, and removing exposed portions of the first dielectric layer;

3.7 depositing a third dielectric layer and forming a sidewall structure on a side surface of the resulting emitter structure through an anisotropic etching process;

3.8 etching portions of the base region that are not covered in the resulting structure of the step 3.7 by using the emitter and the sidewall structure as a mask, with an etching thickness being greater than a thickness of the base region;

3.9 forming an external base region of the second doping type on the resulting structure of the step 3.8 through an in-situ doping selective epitaxy process;

3.10 forming a layer of metal silicide structure on a surface of the external base region; and 3.11 forming a contact hole on the resulting structure of the step 3.10 to lead out an electrode of the emitter and an electrode of the base region.

Particularly, the polycrystalline layer of the step 3.5 is a polysilicon layer or a poly-SiGe layer, and the dielectric layers are formed of silicon oxide or silicon nitride.

Particularly, the etching thickness of the step 3.8 ranges between 10 nm and 2000 nm, and the sidewall is undercut during the etching of the base region.

In a further aspect, the present invention provides a method of forming a bipolar transistor with an embedded epitaxial external base region, which comprises at least the following steps:

6.1 forming a collector region of a first doping type;

6.2 forming a base region of a second doping type on the resulting structure of the step 6.1;

6.3 forming a first dielectric layer on the base region;

6.4 removing exposed portions of the first dielectric layer through photolithography to form a sacrifice emitter;

6.5 etching portions of the base region that are not covered by the sacrifice emitter, with an etching thickness being greater than a thickness of the base region;

6.6 forming an external base region of the second doping type on the resulting structure of the step 6.5;

6.7 depositing a second dielectric layer to form a planarized surface that exposes a top surface of the sacrifice emitter;

6.8 removing portions of a surface layer of the sacrifice emitter to obtain a window, and forming an inner sidewall structure on an inner sidewall of the window;

6.9 removing portions of the sacrifice emitter which are not covered by the inner sidewall;

6.10 depositing a polycrystalline layer;

6.11 removing edge portions of the polycrystalline layer of the step 6.10 and the second dielectric layer of the step 6.7 to form an emitter;

6.12 depositing a metal material on surfaces of the external base region and the emitter to form a metal silicide; and 6.13 forming a contact hole on the resulting structure of the step 6.12 to lead out an electrode of the emitter and an electrode of the base region.

Particularly, the base region is formed of silicon (Si), SiGe or carbon-doped SiGe.

Particularly, the first dielectric layer is a composite dielectric layer, which comprises a silicon oxide layer deposited on a surface of the base region and a silicon nitride layer deposited on a surface of the silicon oxide layer.

In yet another aspect, the present invention provides a method of forming a bipolar transistor with an embedded epitaxial external base region, which comprises at least the following steps:

9.1 forming a collector region of a first doping type;

9.2 forming a base region of a second doping type on the resulting structure of the step 9.1;

9.3 depositing a first silicon oxide layer, a silicon nitride layer and a second silicon oxide layer in sequence on the resulting structure of the step 9.2;

9.4 opening a window in the second silicon oxide layer and the silicon nitride layer;

9.5 removing portions of the first silicon oxide layer that are within the window to expose the base region and to form an emitter window;

9.6 depositing a polycrystalline layer on the resulting structure of the step 9.5;

9.7 planarizing the resulting structure of the step 9.6 to expose the second silicon oxide layer;

9.8 removing the second silicon oxide layer and portions of the silicon nitride layer that are not covered by the polycrystalline layer;

9.9 forming a first sidewall on a side surface of the polycrystalline layer, and removing portions of the first silicon oxide layer that are not covered by the first sidewall;

9.10 etching portions of the base region that are not covered, with an etching thickness being greater than a thickness of the base region;

9.11 forming an external base region of the second doping type on the resulting structure of the step 9.10;

9.12 depositing a dielectric layer to form a second sidewall outside the first sidewall;

9.13 depositing a metal layer on the resulting structure of the step 9.12, forming a metal silicide on the external base region and forming a metal silicide on the polycrystalline layer; and 9.14 forming a contact hole on the resulting structure of the step 9.13 to lead out an electrode of the emitter and an electrode of the base region.

Particularly, the base region is made of Si or SiGe.

Particularly, the sidewall is undercut during the etching of the base region.

Particularly, the metal deposited is one of Ti, Co or Ni.

Particularly, the external base region is formed through an epitaxy growth process, the external base region is formed of Si, SiGe or carbon-doped SiGe, and the impurity is doped at a concentration of 1E19 to 1E21 $cm^{-3}$.

The bipolar transistor with an embedded epitaxial external base region of the present invention is provided with an embedded epitaxial base region, and can avoid the TED effect and also reduce the resistance of the external base region of the device so that the performance of the device is improved.

The method of forming a bipolar transistor with an embedded epitaxial external base region of the present invention achieves the aforesaid bipolar transistor with an embedded epitaxial external base region. The second and the third methods achieve the aforesaid bipolar transistor with an embedded epitaxial external base region through self alignment, and feature concise steps, a low cost and simple operations, and the structures obtained have good performance.

DETAILED DESCRIPTION OF THE INVENTION

Hereinbelow, the present invention will be described in detail with reference to the attached drawings and preferred embodiments thereof.

A bipolar transistor with an embedded epitaxial external base region of the present invention comprises at least a collector region, a base region and an external base region on the collector region, an emitter on the base region, and sidewalls at both sides of the emitter. The external base region is grown through an in-situ doping selective epitaxy process and is embedded in the collector region.

Preferably, a portion of the external base region is located beneath the sidewalls. That is, when the structure is formed, a certain degree of undercutting is performed so that the performance of the bipolar transistor with an embedded epitaxial external base region of the present invention is improved.

The structure of the present invention is not limited to the Si bipolar transistor, and may also be made of other materials such as SiGe or Group III-V compounds.

The bipolar transistor with an embedded epitaxial external base region of the present invention is provided with the embedded epitaxial base region, and can avoid the TED effect and also reduce the resistance of the external base region of the device so that the performance of the device is improved.

The bipolar transistor with an embedded epitaxial external base region of the present invention at least comprises three kinds of basic structures. To achieve the three kinds of structures, the present invention provides three forming methods correspondingly.

Figure 1:
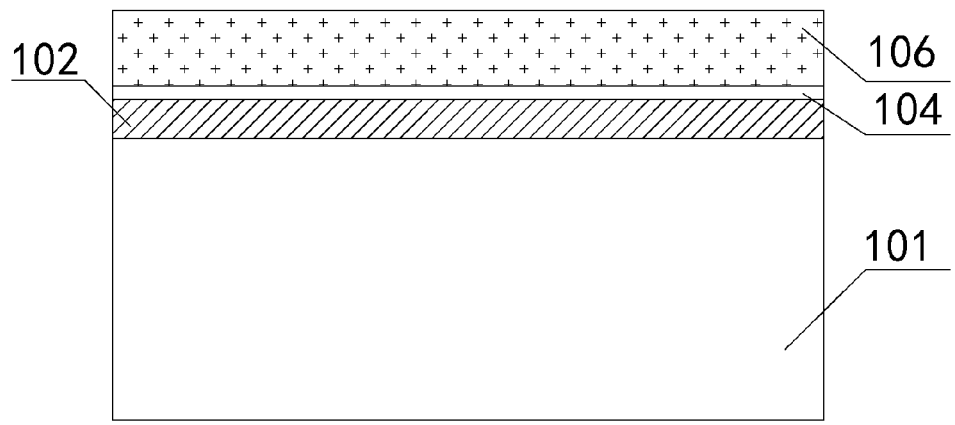
FIG. 1 to FIG. 7 are schematic flowchart diagrams of a first preferred embodiment of the present invention.

Structure I: as shown in FIG. 1, a collector region 101 of a first doping type is formed. A layer of doped base region 102 of a second doping type is formed on the collector region 101 through an epitaxy growth process. The base region 102 may be formed of Si, SiGe or carbon-doped SiGe. A first dielectric layer is deposited on the base region 102. The first dielectric layer is preferably a composite dielectric layer, which comprises a silicon oxide layer 104 and a silicon nitride layer 106 in sequence from bottom to top. The silicon oxide layer is an etch stop layer.

Figure 2:
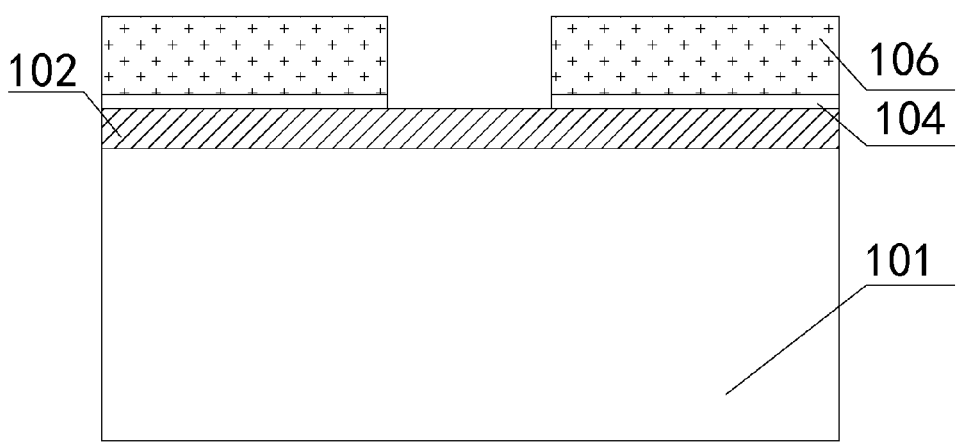
Figure 3:
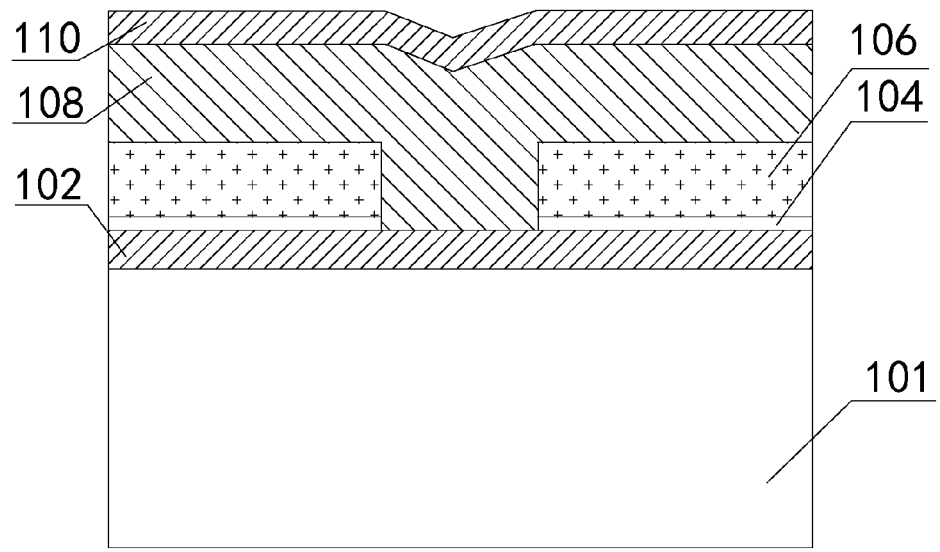

As shown in FIG. 2, the silicon nitride layer 106 is etched through photolithography to form an emitter window, and then the silicon oxide layer 104 is selectively etched to expose monocrystals of the base region 102. The selective etching may be achieved through dry etching or wet etching As shown in FIG. 3, a polycrystalline layer 108 and a second dielectric layer 110 are deposited. The polycrystalline layer 108 may be a polysilicon layer or a poly-SiGe layer. The polycrystalline layer 108 needs to be doped and may be doped through ion implantation or in-situ doping, and the impurity is of the first doping type. The dielectric layer 110 may be a silicon oxide layer or a silicon nitride layer.

Figure 4:
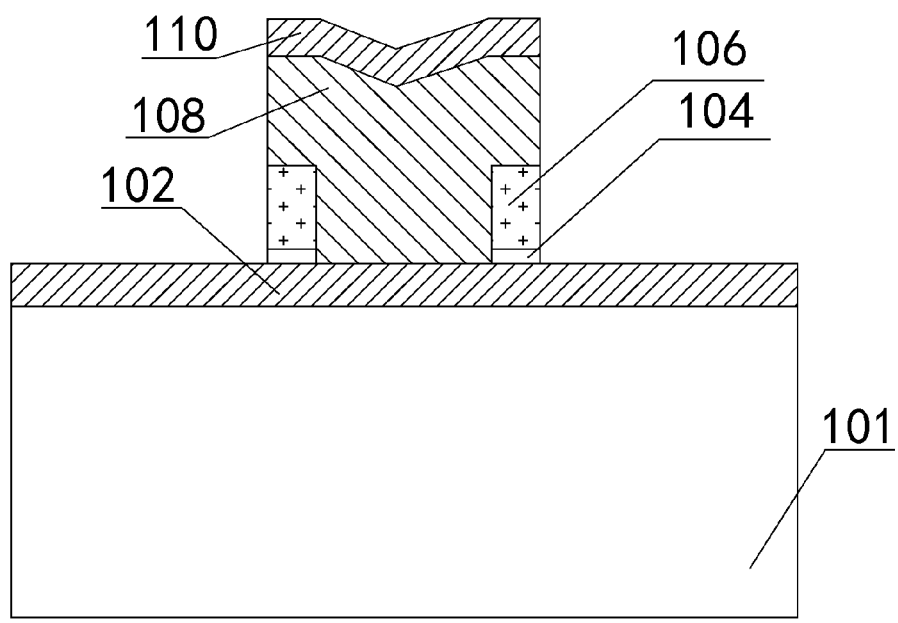

As shown in FIG. 4, the second dielectric layer 110 and the polycrystalline layer 108 are etched through photolithography to form an emitter, and exposed portions of the silicon oxide layer 104 and the silicon nitride layer 106 are removed to expose the monocrystals of the base region 102.

Figure 5:
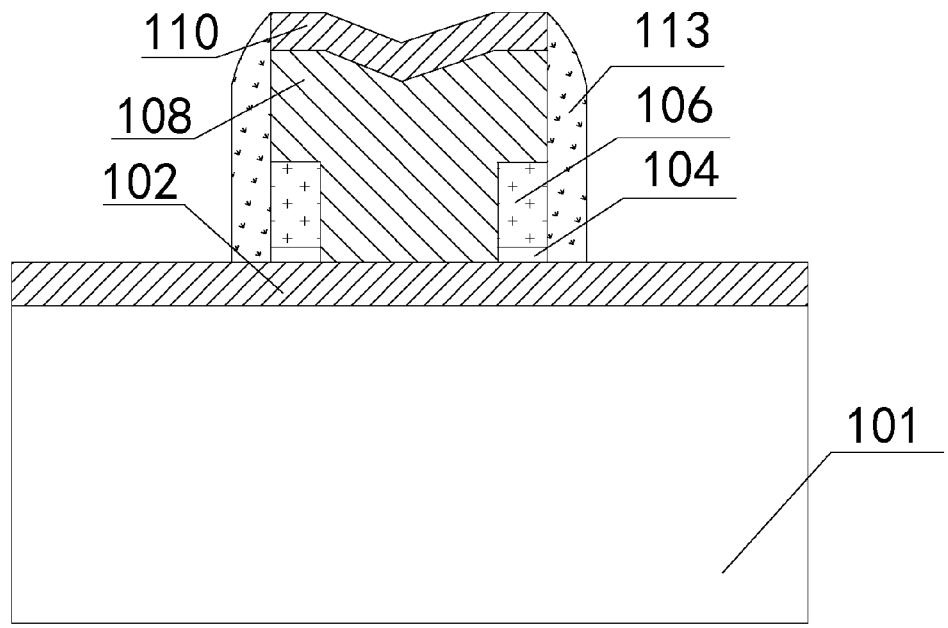

As shown in FIG. 5, a third dielectric layer is deposited, and a sidewall structure 113 is formed on a side surface of the resulting emitter structure through an anisotropic etching process.

Figure 6:
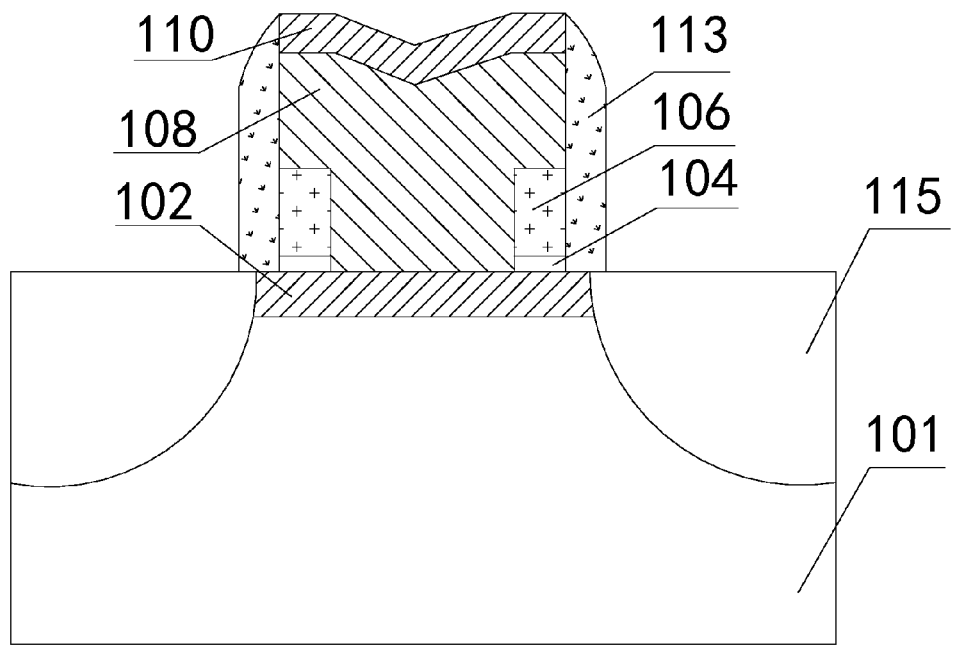

As shown in FIG. 6, by using the emitter structure as a mask, the epitaxial base region 102 is etched to the collector region 101 to obtain an etched region 115. The main purpose of this step is to reduce the TED effect. To reduce the resistance of the external base region, an etching thickness shall be greater than a thickness of the epitaxial base region 102. The preferred etching thickness ranges between 10 nm and 2000 nm. It is best to perform a certain degree of undercutting, which can further reduce the resistance of the external base region.

Figure 7:
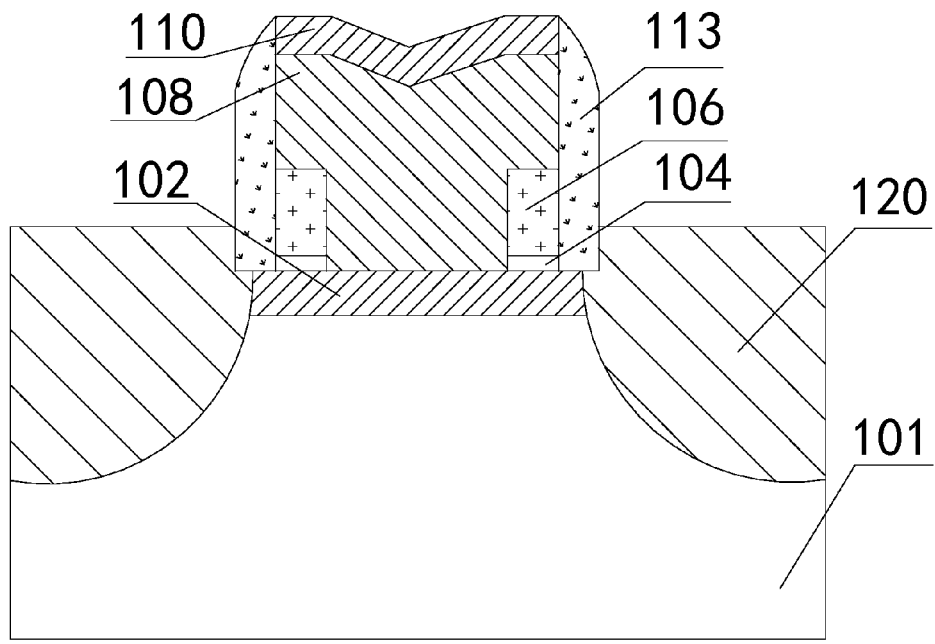

As shown in FIG. 7, a layer of external base region 120 is formed on the etched structure through an in-situ doping selective epitaxy process. The epitaxial layer may be formed of Si, SiGe or carbon-doped SiGe. The impurity is of the second doping type. In order to reduce the resistance of the external base region 120, the doping concentration shall be as high as possible and is generally from 1E19 to 1E21 $cm^{-3}$. For an NPN device, the impurity is generally boron.

A layer of metal silicide structure is formed on a surface of the external base region. Then, a contact hole is formed on the resulting structure to lead out an electrode of the emitter and an electrode of the base region. The method of forming a bipolar transistor with an embedded epitaxial external base region of the present invention achieves the aforesaid bipolar transistor with an embedded epitaxial external base region, and features concise steps, a low cost and simple operations, and the structure obtained has good performance.

Preferred embodiment I: as shown in FIG. 1 to FIG. 7, a collector region 101 of a first doping type is formed, and a layer of doped base region 102 is formed on the collector region 101 through an epitaxy growth process, with the base region being carbon-doped SiGe of a second doping type. A silicon oxide layer 104 and a silicon nitride layer 106 are deposited on the base region 102 in sequence.

The silicon nitride layer 106 is etched through photolithography to form an emitter window, and then the silicon oxide layer 104 is dry etched to expose monocrystals of the base region 102. A polysilicon layer 108 and a silicon oxide layer 110 are deposited. The polysilicon layer 108 of the first doping type is obtained through in-situ doping. The second dielectric layer 110 and the polycrystalline layer 108 are etched through photolithography to form an emitter. Exposed portions of the silicon oxide layer 104 and the silicon nitride layer 106 are removed to expose the monocrystals of the base region 102.

A third dielectric layer is deposited, and a sidewall structure 113 is formed on a side surface of the resulting emitter structure through an anisotropic etching process. By using the emitter structure as a mask, the epitaxial base region 102 is etched to the collector region 101 to obtain an etched region 115, with the etching thickness being 1000 nm and undercutting being performed concomitantly.

A layer of Si external base region 120 is formed on the etched structure through an in-situ doping selective epitaxy process, with the impurity being boron and the doping concentration being 1E20 $cm^{-3}$. A layer of metal silicide structure is formed on a surface of the external base region. Then, a contact hole is formed on the resulting structure to lead out an electrode of the emitter and an electrode of the base region. Thus, the device is finished.

Figure 8:
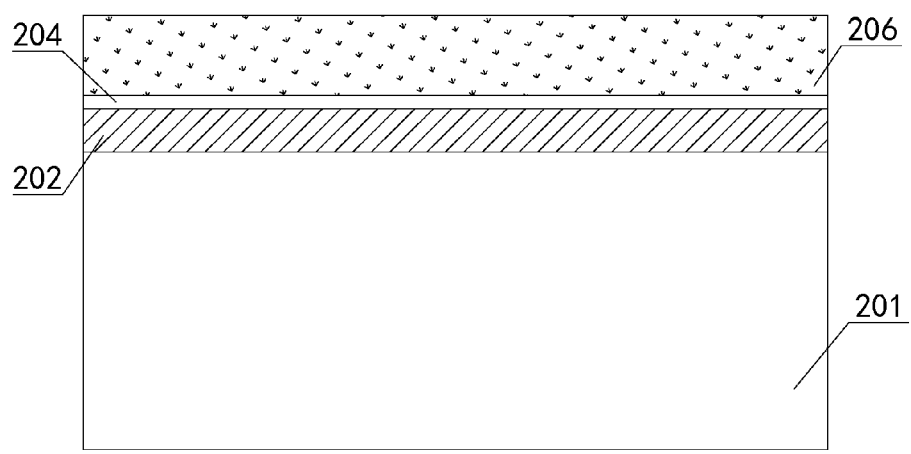
FIG. 8 to FIG. 17 are schematic flowchart diagrams of a second preferred embodiment of the present invention.

Structure II: as shown in FIG. 8, a collector region 201 of a first doping type is formed. A layer of doped base region 202 of a second doping type is formed on the collector region 201 through an epitaxy growth process. The base region 202 may be formed of Si or SiGe. A dielectric layer is deposited on the base region 202. The dielectric layer is preferably a composite dielectric layer, which comprises a silicon oxide layer 204 and a silicon nitride layer 206 in sequence from bottom to top. The silicon oxide layer is an etch stop layer.

Figure 9:
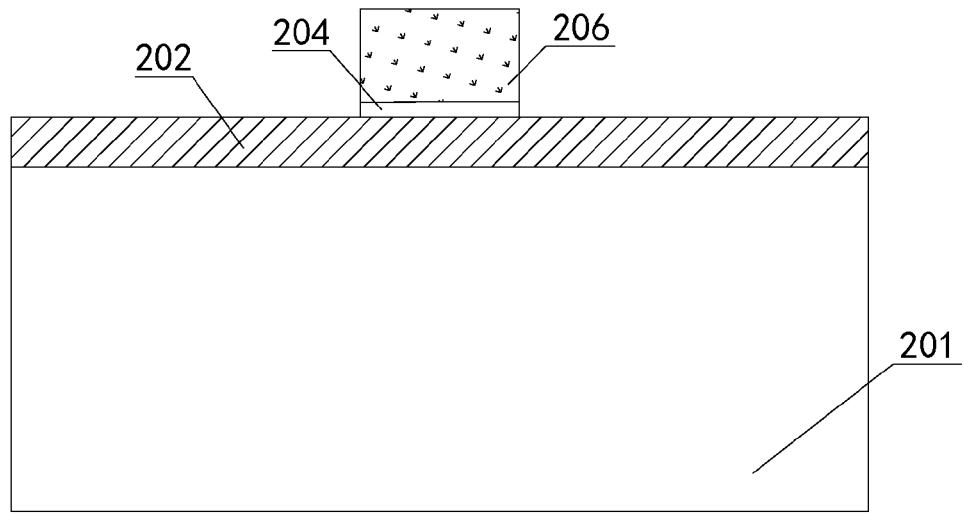

As shown in FIG. 9, the silicon nitride layer 206 and the silicon oxide layer 204 are etched through photolithography to form a sacrifice emitter.

Figure 10:
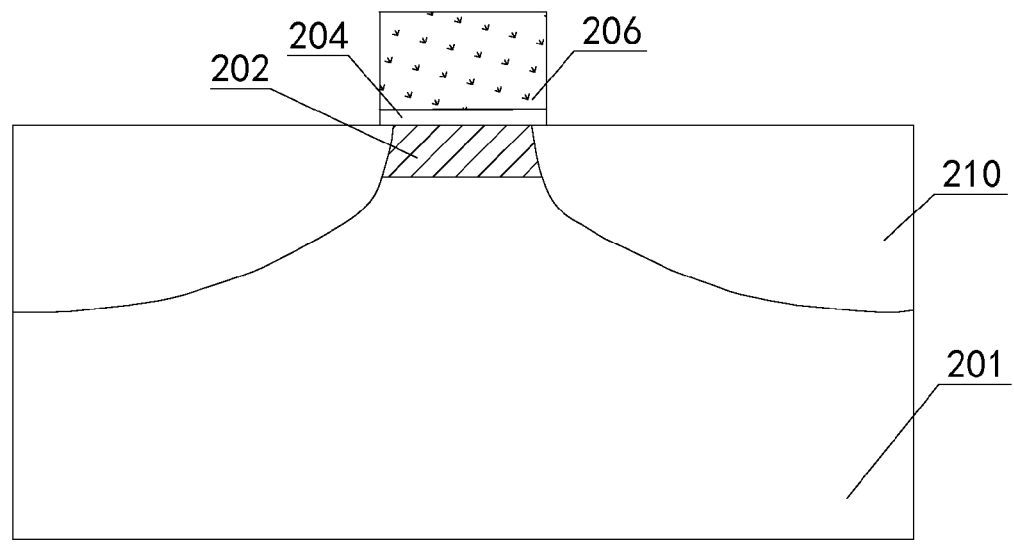

As shown in FIG. 10, the epitaxial base region 202 is etched to the collector region 201 to form an etched structure 210. The main purpose of this step is to reduce the TED effect. To reduce the resistance of the external base region, an etching thickness shall be greater than a thickness of the epitaxial base region 202. It is best to perform a certain degree of undercutting, which can further reduce the resistance of the external base region.

Figure 11:
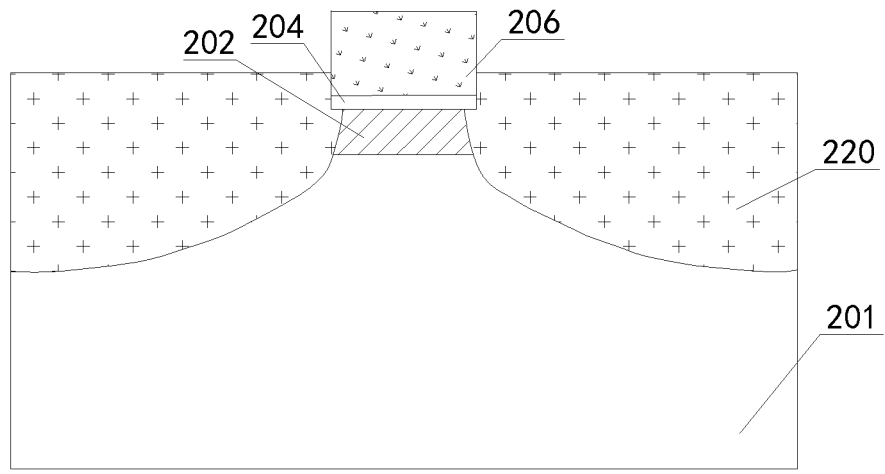

As shown in FIG. 11, a layer of external base region 220 is formed through an in-situ doping selective epitaxy process. The epitaxial layer may be formed of Si or SiGe. In order to reduce the resistance of the external base region, the doping concentration shall be as high as possible and is generally from 1E19 to 1E21 $cm^{-3}$.

Figure 12:
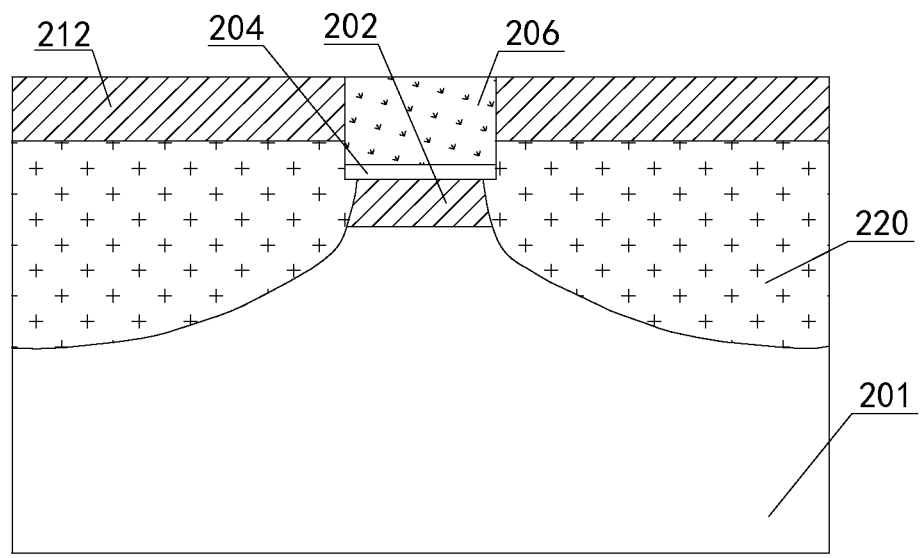

As shown in FIG. 12, a silicon oxide layer 212 is deposited and then planarized through a chemical mechanical planarization (CMP) process or an etch-back process to expose the silicon nitride layer 206 of the sacrifice emitter.

Figure 13:
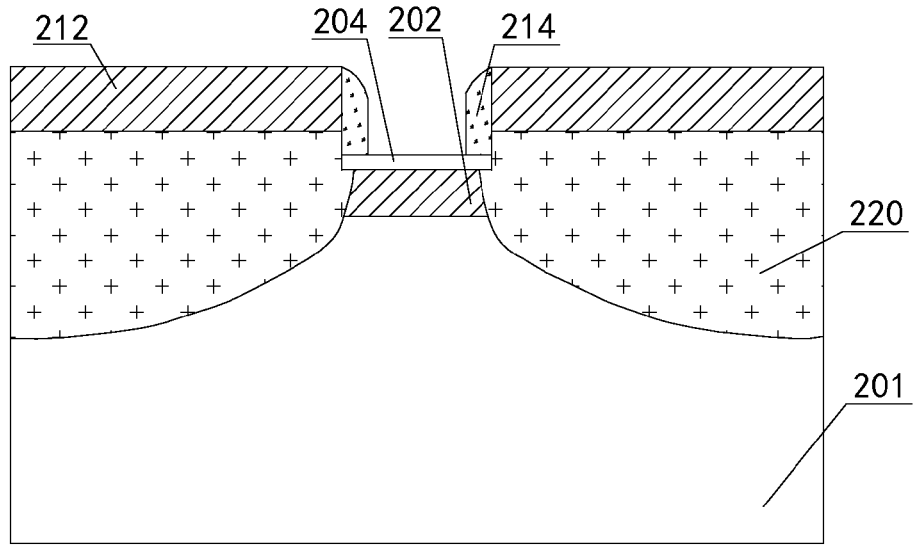

As shown in FIG. 13, the silicon nitride layer 206 of the sacrifice emitter is removed through wet etching, and then a layer of silicon nitride is deposited and formed into an inner sidewall 214 through an anisotropic etching process.

Figure 14:
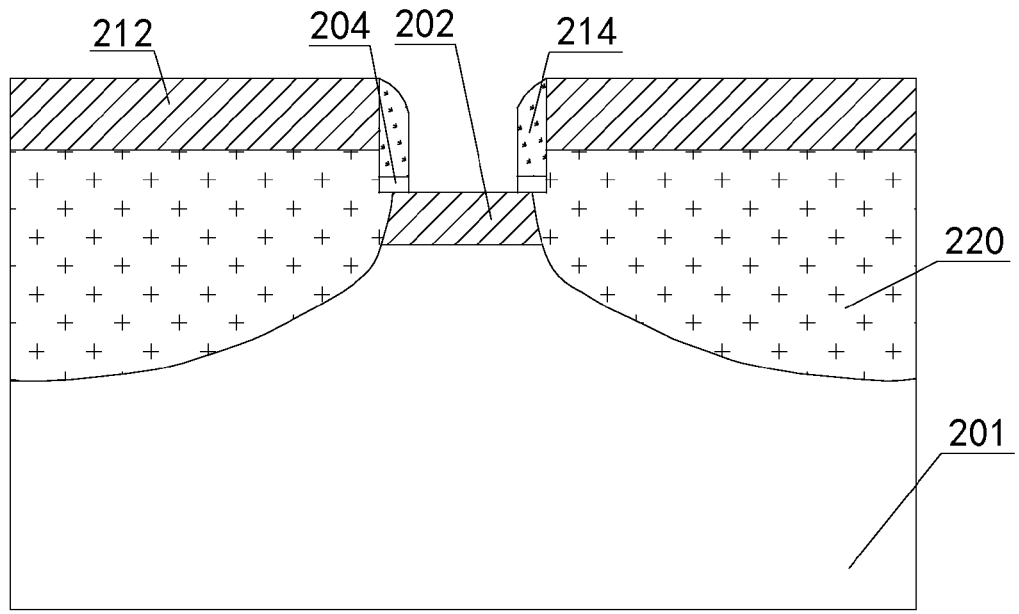

As shown in FIG. 14, portions of the silicon oxide layer 204 in an emitter window which are not covered by the inner sidewall 214 are removed through a selective dry etching process or a selective wet etching process.

Figure 15:
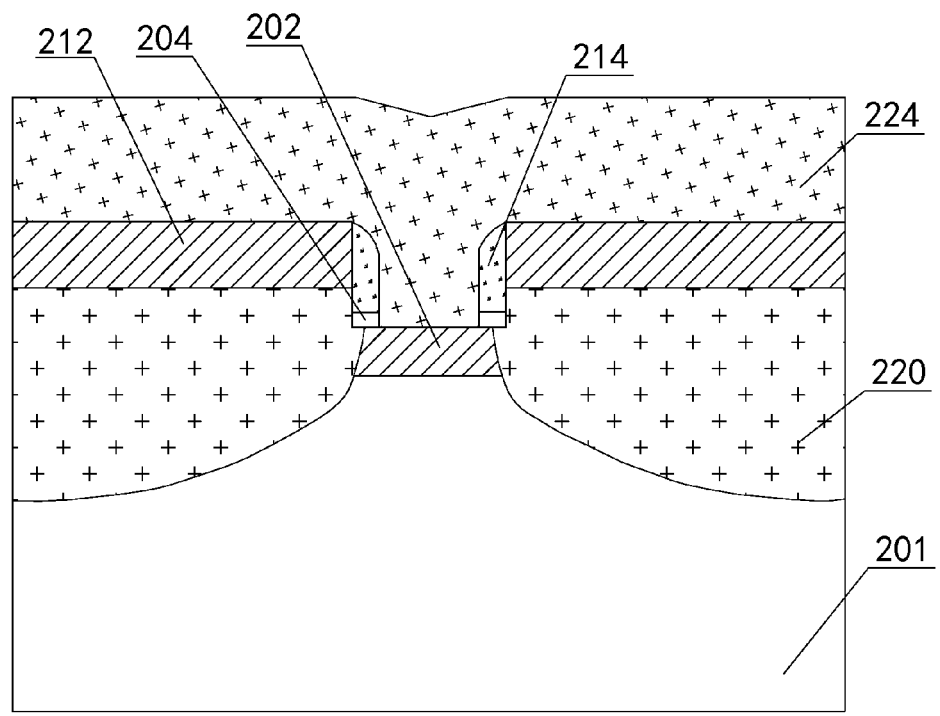

As shown in FIG. 15, a polycrystalline layer 224 is deposited on the resulting structure.

Figure 16:
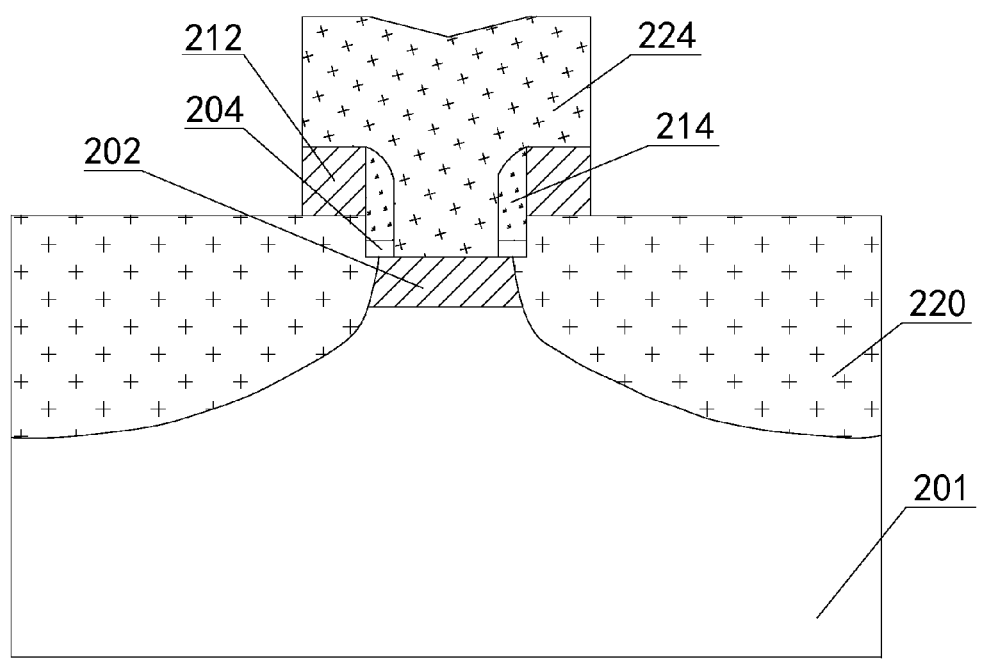

As shown in FIG. 16, the polycrystalline layer 224 and the silicon oxide layer 212 are etched through photolithography in sequence to form an emitter.

Figure 17:
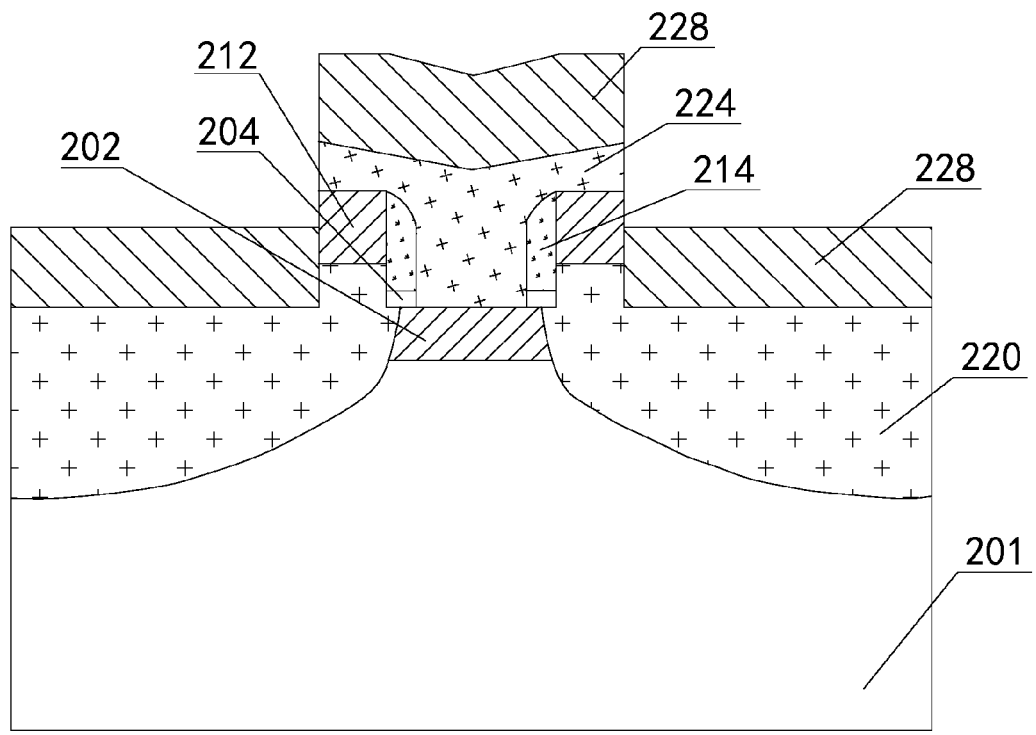

As shown in FIG. 17, a metal material is deposited on surfaces of the external base region 220 and the emitter and then annealed to form a metal silicide structure 228. The metal deposited may be one of Ti, Co or Ni, but is not limited thereto.

A contact hole is formed on the resulting structure to lead out an electrode of the emitter and an electrode of the base region.

Preferred embodiment II: as shown in FIG. 8 to FIG. 17, a collector region 201 of a first doping type is formed. A layer of SiGe-doped base region 202 of a second doping type is formed on the collector region 201 through an epitaxy growth process. A silicon oxide layer 204 and a silicon nitride layer 206 are deposited in sequence on the base region 202.

The silicon nitride layer 206 and the silicon oxide layer 204 are etched through photolithography to form a sacrifice emitter. The epitaxial base region 202 is etched to the collector region 201 to form an etched structure 210. An etching thickness is greater than a thickness of the epitaxial base region 202, and a certain degree of undercutting is performed. A layer of SiGe external base region 220 is formed through an in-situ doping selective epitaxy process, with the doping concentration being 1E20 $cm^{-3}$.

A silicon oxide layer 212 is deposited and then planarized through an etch-back process to expose the silicon nitride layer 206 of the sacrifice emitter. The silicon nitride layer 206 of the sacrifice emitter is removed through wet etching, and then a layer of silicon nitride is deposited and formed into an inner sidewall 214 through an anisotropic etching process. Portions of the silicon oxide layer 204 in an emitter window which are not covered by the inner sidewall 214 are removed through a selective dry etching process.

A polycrystalline layer 224 is deposited on the resulting structure, and the polycrystalline layer 224 and the silicon oxide layer 212 are etched through photolithography in sequence to form an emitter. Ti is deposited on surfaces of the external base region 220 and the emitter and then annealed to form a metal silicide structure 228. A contact hole is formed on the resulting structure to lead out an electrode of the emitter and an electrode of the base region.

Figure 18:
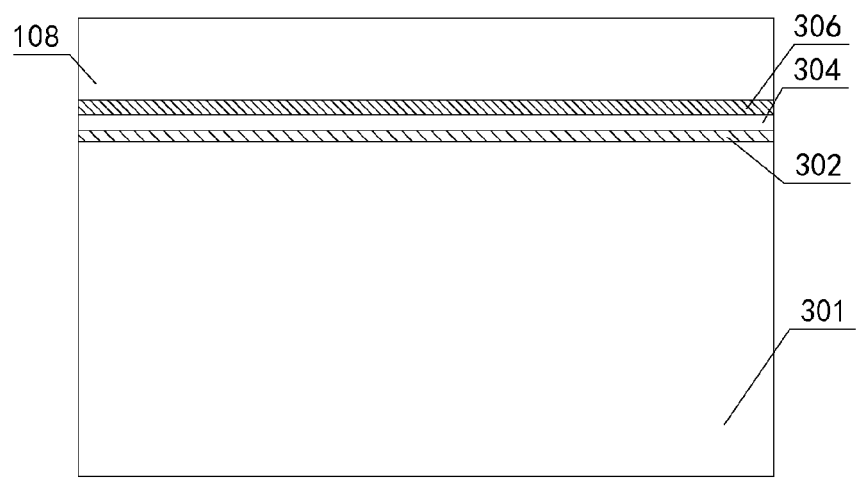
FIG. 18 to FIG. 28 are schematic flowchart diagrams of a third preferred embodiment of the present invention.

Structure III: as shown in FIG. 18, a collector region 301 of a first doping type is formed. A layer of doped base region 302 of a second doping type is formed on the collector region 301 through an epitaxy growth process. The base region 302 may be formed of Si or SiGe. On the base region 302 is deposited a dielectric layer, which comprises a first silicon oxide layer 304, a silicon nitride layer 306 and a second silicon oxide layer 308 in sequence from bottom to top. The second silicon oxide layer 308 is an etch stop layer for protecting the epitaxial base region 302 from being damaged in such processes as the etching process.

Figure 19:
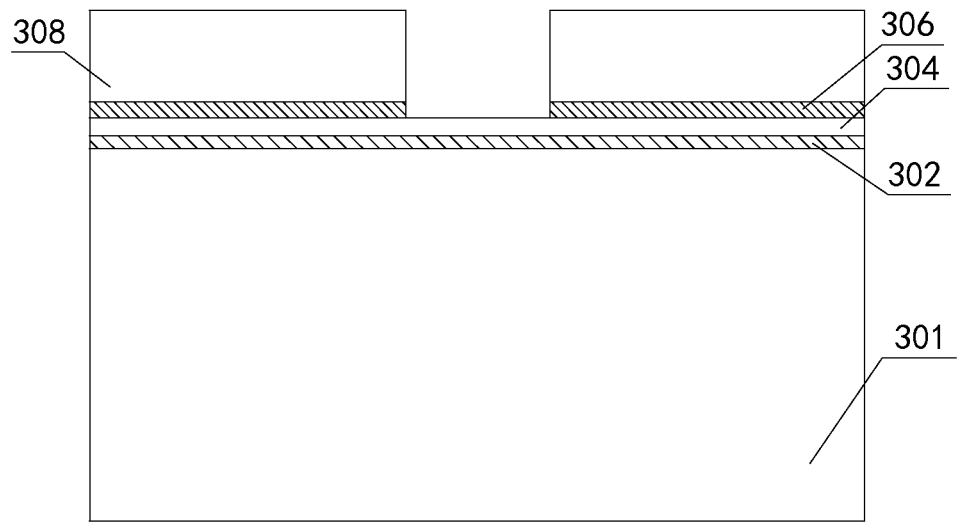

As shown in FIG. 19, the second silicon oxide layer 308 and the silicon nitride layer 306 are etched through photolithography to form a window.

Figure 20:
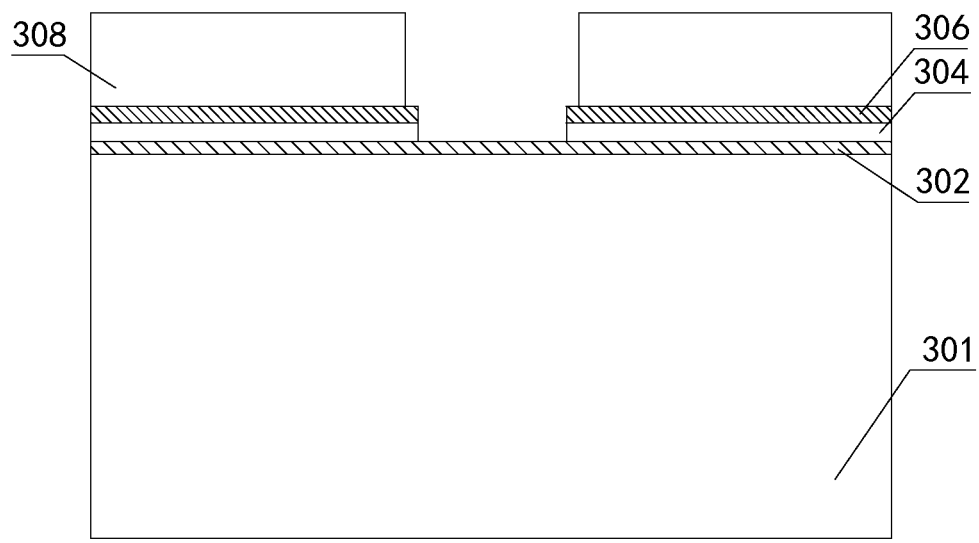

As shown in FIG. 20, a window is opened in the first silicon oxide layer 304 through a selective dry etching process or a selective wet etching process to form an emitter window.

Figure 21:
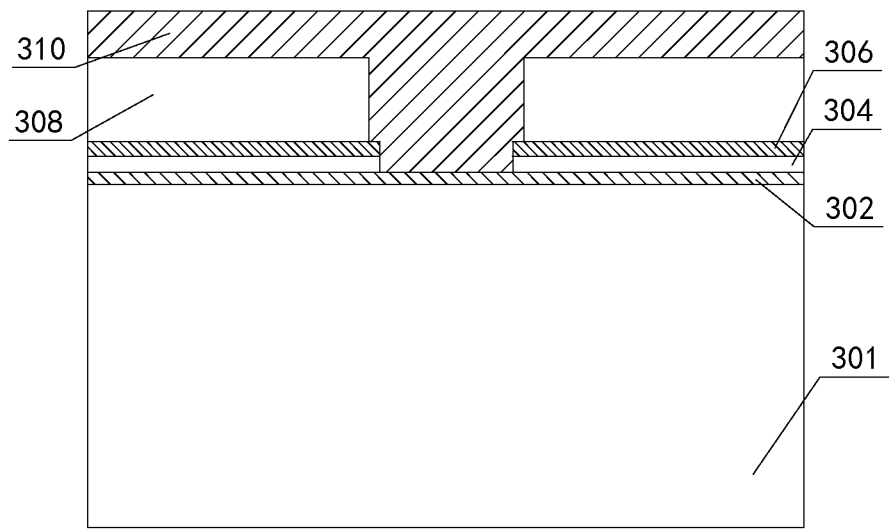

As shown in FIG. 21, a first polycrystalline layer 310 is deposited on the resulting structure, with the first polycrystalline layer 310 being filled in the emitter window and also covering a surface of the resulting structure.

Figure 22:
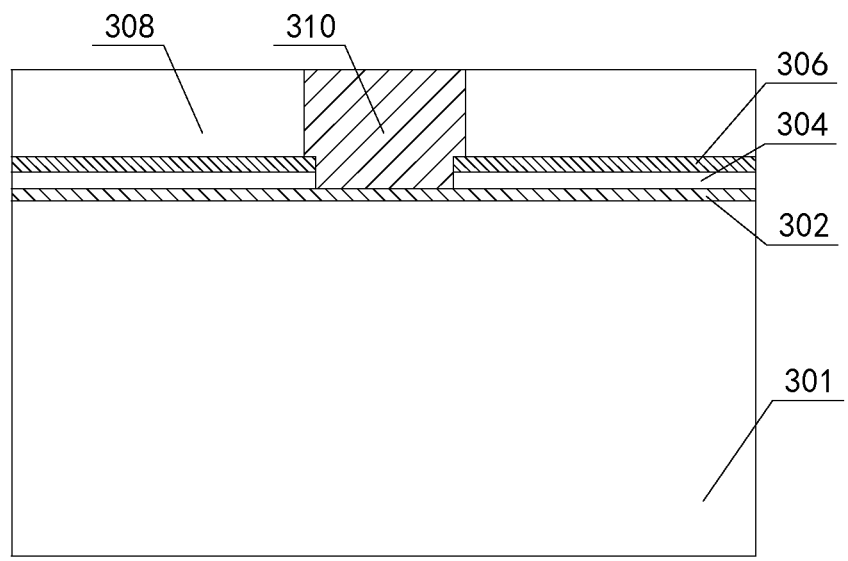

As shown in FIG. 22, a surface layer of the first polycrystalline layer 310 is removed, and the first polycrystalline layer 310 is planarized to the second silicon oxide layer 308. Then, peripheral portions of the dielectric layer are removed through a CMP process or an etch-back process.

Figure 23:
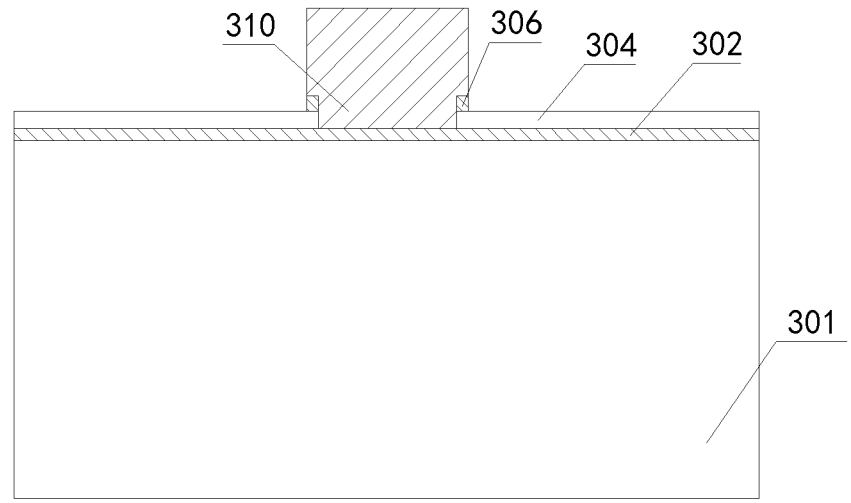

As shown in FIG. 23, the second silicon oxide layer 308 and portions of the silicon nitride layer 306 that are not covered by the first polycrystalline layer 310 are removed through a selective etching process.

Figure 24:
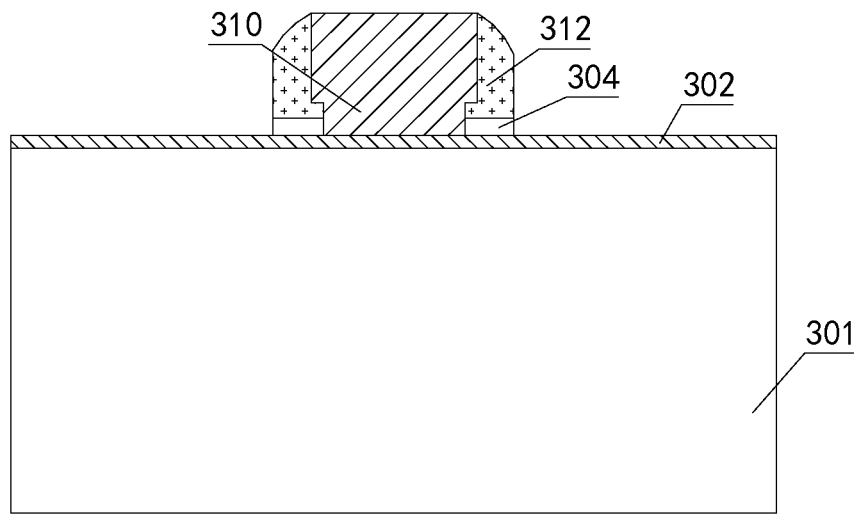

As shown in FIG. 24, a silicon nitride dielectric layer is deposited on the resulting structure and then etched into a first sidewall 312 structure; and then, portions of the first silicon oxide layer 304 that are not covered by the first sidewall 312 are etched off.

Figure 25:
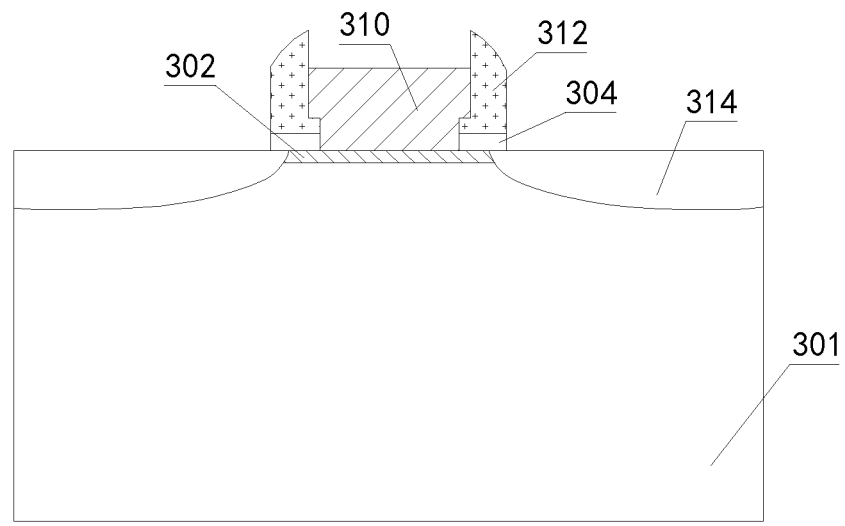

As shown in FIG. 25, the external base region 302 is etched to the collector region 301 to form an etched structure 314. The main purpose of this step is to reduce the TED effect. To reduce the resistance of the external base region, an etching thickness shall be greater than a thickness of the epitaxial base region 302. It is best to perform a certain degree of undercutting, which can further reduce the resistance of the external base region. In the etching process, a portion of a surface of the first polycrystalline layer on the emitter is also etched off.

Figure 26:
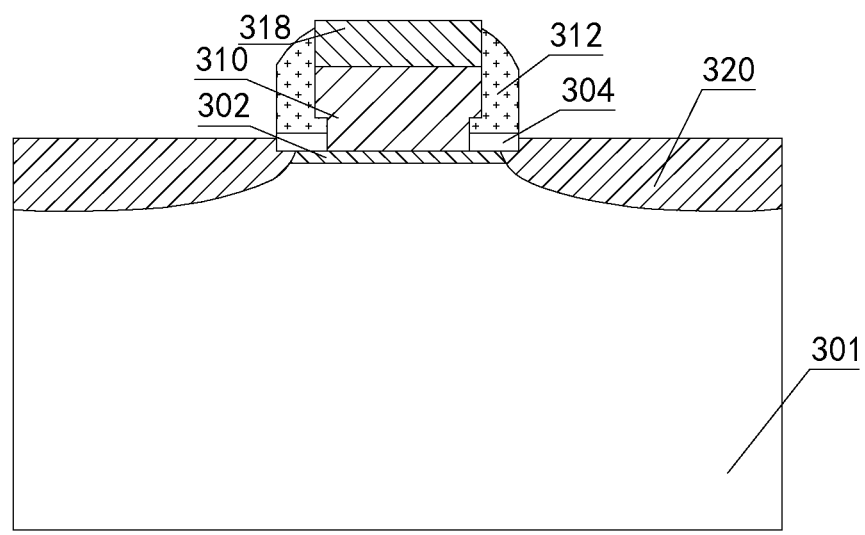

As shown in FIG. 26, a layer of external base region 320 is formed through an in-situ doping selective epitaxy process. The epitaxial layer may be formed of Si or SiGe. In order to reduce the resistance of the external base region 320, the doping concentration shall be as high as possible and is generally from 1E19 to 1E21 $cm^{-3}$. A second polycrystalline layer 318 is also deposited on the emitter.

Figure 27:
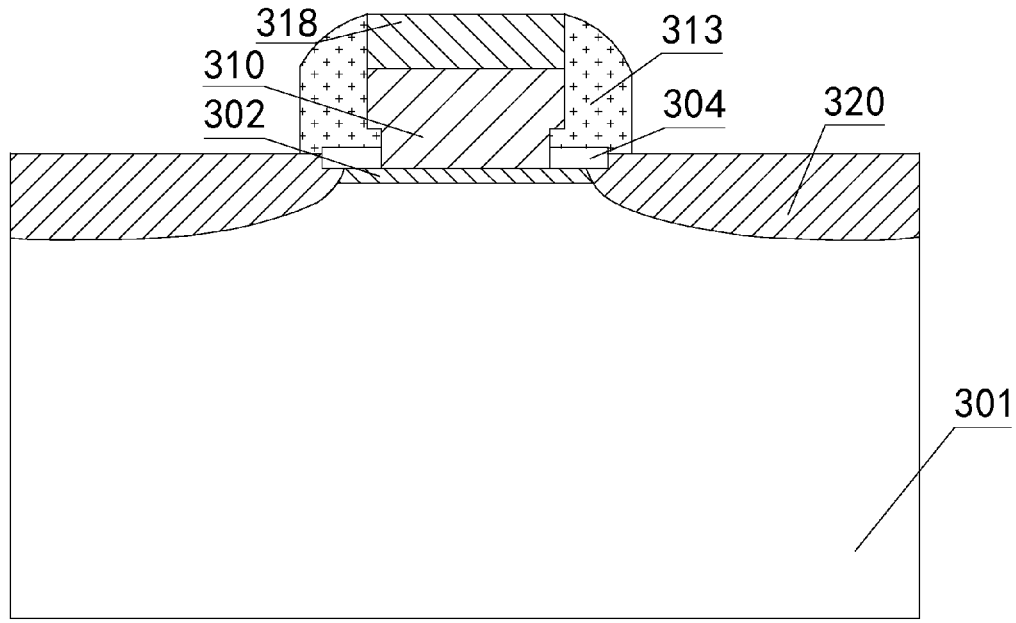

As shown in FIG. 27, a dielectric layer (e.g., a silicon nitride dielectric layer) is deposited and then etched into a second sidewall 313 at the position of the first sidewall 312.

Figure 28:
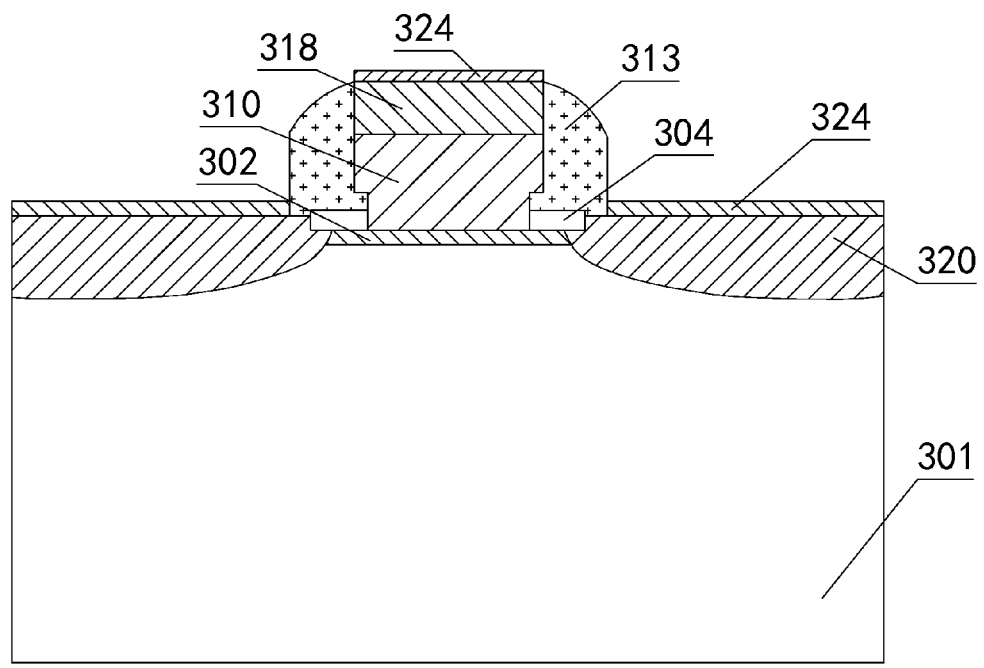

As shown in FIG. 28, a metal layer is deposited on the resulting structure, a metal silicide 324 is formed on the external base region 320 and a metal silicide 324 is formed on the second polycrystalline layer 318.

A contact hole is formed on the resulting structure to lead out an electrode of the emitter and an electrode of the base region.

Preferred embodiment III: as shown in FIG. 18 to FIG. 28, a collector region 301 of a first doping type is formed. A layer of Si-doped base region 302 of a second doping type is formed on the collector region 301 through an epitaxy growth process. On the base region 302 is deposited a dielectric layer, which comprises a first silicon oxide layer 304, a silicon nitride layer 306 and a second silicon oxide layer 308 in sequence from bottom to top. The second silicon oxide layer 308 and the silicon nitride layer 306 are etched through photolithography to form a window.

A window is opened in the first silicon oxide layer 304 through a selective dry etching process to form an emitter window. A first polycrystalline layer 310 is deposited on the resulting structure, with the first polycrystalline layer 310 being filled in the emitter window and also covering a surface of the resulting structure. A surface layer of the first polycrystalline layer 310 is removed, and the first polycrystalline layer 310 is planarized to the second silicon oxide layer 308. Then, peripheral portions of the dielectric layer are removed through a CMP process.

The second silicon oxide layer 308 and portions of the silicon nitride layer 306 that are not covered by the first polycrystalline layer 310 are removed through a selective etching process. A silicon nitride dielectric layer is deposited on the resulting structure and then etched into a first sidewall 312 structure; and then, portions of the first silicon oxide layer 304 that are not covered by the first sidewall 312 are etched off.

The external base region 302 is etched to the collector region 301 to form an etched structure 314, with an etching thickness being greater than a thickness of the epitaxial base region 302 and a certain degree of undercutting being performed concomitantly. In the etching process, a portion of a surface of the first polycrystalline layer on the emitter is also etched off.

A layer of Si external base region 320 is formed through an in-situ doping selective epitaxy process, with the doping concentration being 1E20 $cm^{-3}$. A second polycrystalline layer 318 is also deposited on the emitter. A silicon nitride dielectric layer is deposited and then etched into a second sidewall 313 at the position of the first sidewall 312. A metal layer is deposited on the resulting structure, a metal silicide 324 is formed on the external base region 320 and a metal silicide 324 is formed on the second polycrystalline layer 318. A contact hole is formed on the resulting structure to lead out an electrode of the emitter and an electrode of the base region.

What described above are only preferred embodiments of the present invention but are not intended to limit the scope of the present invention. Accordingly, any modifications or substitutions that can be readily devised by those skilled in the art within the technical scope of the present invention shall also fall within the scope of the present invention. Therefore, the protective scope of the present invention shall be governed by the claims.

What is claimed is:

1. A method of forming a bipolar transistor with an embedded epitaxial external base region, comprising at least the following steps:

3.1 forming a collector region of a first doping type;

3.2 forming a base region of a second doping type on the resulting structure of the step 3.1;

3.3 depositing a first dielectric layer on the base region;

3.4 opening a window in the first dielectric layer;
3.5 forming a polycrystalline layer of the first doping type and a second dielectric layer in sequence on the resulting structure of the step 3.4;
3.6 etching the second dielectric layer and the polycrystalline layer through photolithography to form an emitter, and removing exposed portions of the first dielectric layer;
3.7 depositing a third dielectric layer and forming a sidewall structure on a side surface of the resulting emitter structure through an anisotropic etching process;
3.8 etching portions of the base region that are not covered in the resulting structure of the step 3.7 by using the emitter and the sidewall structure as a mask, with an etching thickness being greater than a thickness of the base region;
3.9 forming an external base region of the second doping type on the resulting structure of the step 3.8 through an in-situ doping selective epitaxy process;
3.10 forming a layer of metal silicide structure on a surface of the external base region; and
3.11 forming a contact hole on the resulting structure of the step 3.10 to lead out an electrode of the emitter and an electrode of the base region.

2. The method of forming a bipolar transistor with an embedded epitaxial external base region of claim 1, wherein the polycrystalline layer of the step 3.5 is a polysilicon layer or a poly-SiGe layer, and the dielectric layers are formed of silicon oxide or silicon nitride.

3. The method of forming a bipolar transistor with an embedded epitaxial external base region of claim 1, wherein the etching thickness of the step 3.8 ranges between 10 nm and 2000 nm, and the sidewall is undercut during the etching of the base region.

4. The method of forming a bipolar transistor with an embedded epitaxial external base region of claim 1, wherein the base region is formed of silicon (Si), SiGe or carbon-doped SiGe.

5. The method of forming a bipolar transistor with an embedded epitaxial external base region of claim 1, wherein the first dielectric layer is a composite dielectric layer, which comprises a silicon oxide layer deposited on a surface of the base region and a silicon nitride layer deposited on a surface of the silicon oxide layer.

6. The method of forming a bipolar transistor with an embedded epitaxial external base region of claim 1, wherein the external base region is formed through an epitaxy growth process, the external base region is formed of Si, SiGe or carbon-doped SiGe, and the impurity is doped at a concentration of 1E19 to 1 E21 $cm^{-3}$.

7. A method of forming a bipolar transistor with an embedded epitaxial external base region, comprising at least the following steps:
6.1 forming a collector region of a first doping type;
6.2 forming a base region of a second doping type on the resulting structure of the step 6.1;
6.3 forming a first dielectric layer on the base region;
6.4 removing exposed portions of the first dielectric layer through photolithography to form a sacrifice emitter;
6.5 etching portions of the base region that are not covered by the sacrifice emitter, with an etching thickness being greater than a thickness of the base region;
6.6 forming an external base region of the second doping type on the resulting structure of the step 6.5;
6.7 depositing a second dielectric layer to form a planarized surface that exposes a top surface of the sacrifice emitter;
6.8 removing portions of a surface layer of the sacrifice emitter to obtain a window, and forming an inner sidewall structure on an inner sidewall of the window;
6.9 removing portions of the sacrifice emitter which are not covered by the inner sidewall;
6.10 depositing a polycrystalline layer;
6.11 removing edge portions of the polycrystalline layer of the step 6.10 and the second dielectric layer of the step 6.7 to form an emitter;
6.12 depositing a metal material on surfaces of the external base region and the emitter to form a metal silicide; and
6.13 forming a contact hole on the resulting structure of the step 6.12 to lead out an electrode of the emitter and an electrode of the base region.

8. The method of forming a bipolar transistor with an embedded epitaxial external base region of claim 7, wherein the base region is formed of silicon (Si), SiGe or carbon-doped SiGe.

9. The method of forming a bipolar transistor with an embedded epitaxial external base region of claim 7, wherein the first dielectric layer is a composite dielectric layer, which comprises a silicon oxide layer deposited on a surface of the base region and a silicon nitride layer deposited on a surface of the silicon oxide layer.

10. The method of forming a bipolar transistor with an embedded epitaxial external base region of claim 7, wherein the sidewall is undercut during the etching of the base region.

11. The method of forming a bipolar transistor with an embedded epitaxial external base region of claim 7, wherein the metal deposited is one of Ti, Co or Ni.

12. The method of forming a bipolar transistor with an embedded epitaxial external base region of claim 7, wherein the external base region is formed through an epitaxy growth process, the external base region is formed of Si, SiGe or carbon-doped SiGe, and the impurity is doped at a concentration of 1E19 to 1 E21 $cm^{-3}$.

13. A method of forming a bipolar transistor with an embedded epitaxial external base region, comprising at least the following steps:
9.1 forming a collector region of a first doping type;
9.2 forming a base region of a second doping type on the resulting structure of the step 9.1;
9.3 depositing a first silicon oxide layer, a silicon nitride layer and a second silicon oxide layer in sequence on the resulting structure of the step 9.2;
9.4 opening a window in the second silicon oxide layer and the silicon nitride layer;
9.5 removing portions of the first silicon oxide layer that are within the window to expose the base region and to form an emitter window;
9.6 depositing a polycrystalline layer on the resulting structure of the step 9.5;
9.7 planarizing the resulting structure of the step 9.6 to expose the second silicon oxide layer;
9.8 removing the second silicon oxide layer and portions of the silicon nitride layer that are not covered by the polycrystalline layer;
9.9 forming a first sidewall on a side surface of the polycrystalline layer, and removing portions of the first silicon oxide layer that are not covered by the first sidewall;
9.10 etching portions of the base region that are not covered, with an etching thickness being greater than a thickness of the base region;
9.11 forming an external base region of the second doping type on the resulting structure of the step 9.10;
9.12 depositing a dielectric layer to form a second sidewall outside the first sidewall;

9.13 depositing a metal layer on the resulting structure of the step 9.12, forming a metal silicide on the external base region and forming a metal silicide on the polycrystalline layer; and 9.14 forming a contact hole on the resulting structure of the step 9.13 to lead out an electrode of the emitter and an electrode of the base region.

14. The method of forming a bipolar transistor with an embedded epitaxial external base region of claim 13, wherein the base region is made of Si or SiGe.

15. The method of forming a bipolar transistor with an embedded epitaxial external base region of claim 13, wherein the sidewall is undercut during the etching of the base region.

16. The method of forming a bipolar transistor with an embedded epitaxial external base region of claim 13, wherein the metal deposited is one of Ti, Co or Ni.

17. The method of forming a bipolar transistor with an embedded epitaxial external base region of claim 13, wherein the external base region is formed through an epitaxy growth process, the external base region is formed of Si, SiGe or carbon-doped SiGe, and the impurity is doped at a concentration of 1E19 to 1E21 $cm^{-3}$.

* * * * *